(12) United States Patent
Stevens et al.

(10) Patent No.: US 8,078,446 B2
(45) Date of Patent: Dec. 13, 2011

(54) LINEAR TIME-INVARIANT SYSTEM MODELING APPARATUS AND METHOD OF GENERATING A PASSIVE MODEL

(75) Inventors: Nobby Stevens, Sint-Maria-Oudenhove (BE); Tom Dhaene, Ghent (BE)

(73) Assignee: Agilent Technologies, Inc., Santa Clara, CA (US)

( * ) Notice: Subject to any disclaimer, the term of this patent is extended or adjusted under 35 U.S.C. 154(b) by 767 days.

(21) Appl. No.: 12/047,943

(22) Filed: Mar. 13, 2008

(65) Prior Publication Data
US 2009/0234631 A1    Sep. 17, 2009

(51) Int. Cl.
*G06F 17/50* (2006.01)
(52) U.S. Cl. .......................... 703/14; 330/295; 700/263
(58) Field of Classification Search ............ 703/14, 703/2, 13; 708/446; 375/259, 260; 600/486; 330/295; 360/65; 702/75, 85; 700/263
See application file for complete search history.

(56) References Cited

U.S. PATENT DOCUMENTS

| | | | | |
|---|---|---|---|---|
| 5,581,666 | A * | 12/1996 | Anderson | 700/263 |
| 5,748,506 | A * | 5/1998 | Bockelman | 702/85 |
| 5,946,482 | A * | 8/1999 | Barford et al. | 703/14 |
| 2003/0171682 | A1 * | 9/2003 | Zhang et al. | 600/486 |
| 2004/0125487 | A9 * | 7/2004 | Sternad et al. | 360/65 |
| 2005/0175111 | A1 * | 8/2005 | Dhaene et al. | 375/259 |
| 2006/0095236 | A1 * | 5/2006 | Phillips | 703/2 |
| 2006/0119433 | A1 * | 6/2006 | Proehl | 330/295 |
| 2006/0217948 | A1 * | 9/2006 | Humphrey et al. | 703/14 |
| 2007/0073499 | A1 * | 3/2007 | Sawyer et al. | 702/75 |
| 2007/0098090 | A1 * | 5/2007 | Ma et al. | 375/260 |
| 2008/0052337 | A1 * | 2/2008 | Adams | 708/446 |
| 2009/0177456 | A1 * | 7/2009 | Jandhyala et al. | 703/14 |

OTHER PUBLICATIONS

Lamecki et al., "Equivalent SPICE circuits with guaranteed passivity from nonpassive models", IEEE 2007.*
Schroder et al., "Passivation of LTI systems", DFG research center, Matheon, 2007.*
Rahman et al., "Deconvolution and total least squares in finding the impulse response of an electromagnetic system for measured data", IEEE 1995.*
Schutt-Aine et al., "Nonlinear transient analysis of coupled transmission lines", IEEE 1989.*

(Continued)

*Primary Examiner* — Kandasamy Thangavelu (57) ABSTRACT

A linear time-invariant system modeling apparatus comprises a processing resource arranged to receive, when in use, model data constituting to a model of a linear time-invariant system. The model data includes residual value data and scattering data. The processing resource is arranged to perform, when in use, a single value decomposition in respect of the scattering data; the scattering data corresponds, when expressed in matrix form, to a scattering matrix in a state-space representation of the model. The processing resource is also arranged to use, when in use, a result of the single value decomposition in order to generate residual value modification data. The residual value modification data is applied to the residual value data, the residual value data corresponding, when expressed in the matrix form, to a residual value matrix in the state-space representation of the model.

20 Claims, 5 Drawing Sheets

OTHER PUBLICATIONS

Porkar et al., "Passivity enforcement via residues perturbation for admittance representation of power system components", Iranian Journal of Science & Technology, 2007.*

Mandrekar, R., "Modelling and co-simulation of signal distribution and Power delivery in packaged digital systems", School of Electrical and computer engineering, georgia Institute of Technology, May 2006.*

Bockelman et al., "Combined differential and common-mode scattering parameters: theory and simulation", IEEE 1995.*

Min, S., "Automated construction of macromodels from frequency data for simulation of distributed interconenct networks", Achool of Electrical and commputer engineeing, Georgia Institute of Technology, 2004.*

Antoulas et al., "Approximation of large scale dynamical systems: An overview", MTNS, Perpignan, 2001.*

Min et al., "Construction of broadband passive macromodels from frequency data for simulation of distributed interconnect networks", IEEE 2004.*

Gustavsen et al., Rational Approximation of Frequency Domain Responses by Vector Fitting, IEEE Transactions on Power Delivery, Jul. 1999, pp. 1052-1061, vol. 14 No. 3, IEEE, USA.

Lamperez et al., Generation of Accurate Rational Models of Lossy Systems Using the Cauchy Method, IEEE Microwave and Wireless Components Letters, Oct. 2004, pp. 490-492, vol. 14 No. 10, IEEE, USA.

Lamecki et al., Equivalent SPICE Circuits with Guaranteed Passivity from Nonpassive Models, IEEE Transactions on Microwave Theory and Techniques, Mar. 2007, pp. 526-532, vol. 55 No. 3, IEEE, USA.

Grivet-Talocia, Passivity Enforcement via Perturbation of Hamiltonian Matrices, IEEE Transactions on Circuits and Systems, Sep. 2004, pp. 1755-1769, vol. 51 No. 9, IEEE, USA.

Gustavsen, Computer Code for Passivity Enforcement of Rational Macromodels by Residue Perturbation, IEEE Transactions on Advanced Packaging, May 2007, pp. 209-215, vol. 30 No. 2, IEEE, USA.

Saraswat et al., Fast Passivity Verification and Enforcement via Reciprocal Systems for Interconnects with Large Order Macromodels, IEEE Transactions on Very Large Scale Intergration (VLSI) Systems, Jan. 2007, pp. 48-59, vol. 15 No. 1, IEEE, USA.

Saraswat et al., A Fast Algorithm and Practical Considerations for Passive Macromodeling of Measured/Simulated Data, IEEE Transactions on Advanced Packaging, Feb. 2004, pp. 57-70, IEEE, USA.

Boyd et al., A Bisection Method for Computing the H Norm of a Transfer Matrix and Related Problems, Mathematics of Control Signals Systems, 1989, pp. 207-219, Springer-Veriag New York Inc., USA.

* cited by examiner

LINEAR TIME-INVARIANT SYSTEM MODELING APPARATUS AND METHOD OF GENERATING A PASSIVE MODEL

BACKGROUND

The present invention relates to a linear time-invariant system modeling apparatus of the type that, for example, is used to characterize behavior of the linear time-invariant system in a time-domain. The present invention also relates to a method of generating a passive model of a linear time-invariant system from a non-passive model of the linear time-invariant system, the method being of the type that, for example, is used to characterize behavior of the linear time-invariant system in a time-domain.

In the field of electronic design, engineers, for example microwave engineers, need to analyze, design, and simulate active and passive microwave components and systems. In the face of complex communications signal formats, design verification is challenging. Furthermore, whilst designs can be analyzed early in simulation and verified later once a prototype has returned from fabrication, modern pressures upon vendors to respond rapidly to market requirements means that the designer does not necessarily have the luxury of waiting for fabricated hardware to complete a design. Consequently, designers employ an intermediate level of verification to cut overall design time and reduce risk and cost.

In this respect, the field of electronic design automation strives to provide engineers with tools for modeling and analyzing performance of a design or a part thereof. One known suite of analysis tools for so-called high-frequency design is the Advanced Design System (ADS) available from Agilent Technologies, Inc. The ADS is a Computer Aided Design (CAD) program that supports system and RF design engineers when developing all types of Radio Frequency (RF) designs, ranging from, for example, RF/microwave modules to Monolithic Microwave Integrated Circuits (MMICS) for communications, aerospace and other applications.

The ADS provides a set of simulation technologies ranging from frequency-domain circuit simulation to electromagnetic field simulation. A single, integrated, design environment provides system and circuit simulators, along with schematic capture, layout, and verification capability, thereby eliminating interruptions associated with changing design tools mid-cycle during development. Indeed, verification very early in a prototyping cycle for applications is possible Furthermore, the ADS enables designers to characterize fully and optimize designs. In relation to electromagnetic simulation and/or measurement, most commercial simulation and/or measurement tools perform the simulation and/or measurement in the frequency domain. In this respect, a set of frequency points, for example between 0 Hz and 10 GHz, and associated values, for example amplitudes, are sampled for analysis purposes. However, in order to perform a so-called transient simulation, information is required in the context of the time domain, and significant difficulty is associated with converting frequency domain data to the time domain.

Often, it is necessary to model a so-called Linear Time Invariant (LTI) system. Generally speaking, most passive components either alone or in combination constitute members of a group of LTI systems. A physical example of the LTI system is a microstrip transmission line, a known type of electrical circuit designed to transmit efficiently electromagnetic energy at high frequencies where traditional circuits become inefficient, that needs to be designed and analyzed. The LTI system can be represented in the form of a rational function. In this respect, two examples techniques used to identify the rational function are so-called Vector Fitting (VF), for example as described in "Rational Approximation of Frequency Domain Responses by Vector Fitting" (B. Gustavsen and A. Semlyen, IEEE Transactions on Power Delivery, 14:1052-1061, July 1999), and direct interpolation, for example as described in "Generation of Accurate Rational Models of Lossy Systems using the Cauchy Method" (T. K. Sarkar, A. G. Lamperez and M. S. Palma, Microwave and Wireless Components Letters, 14:490-492, October 2004). In both cases, one obtains a rational function (model) in the Laplace domain of the form:

$$S_{nm}(s) = d^{nm} + \sum_{k=1}^{K} \frac{c_k^{nm}}{s - p_k^{nm}} \qquad (1)$$

In equation (1) above, $S_{nm}$ is an element at row n, column m of a scattering matrix. $d^{nm}$ is a constant contribution, $p_k^{nm}$ represents the poles of the rational function and $c_k^{nm}$ are residues of the rational function. All elements of the scattering matrix can be fitted to the same set of poles ($p_k^{nm}=p_k$) or with a separate set of poles can be used in respect of each element of the scattering matrix.

It is, of course, important that, when performing a simulation, the rational function employed is as close to the actual data initially obtained, either empirically or by simulation, for the LTI system being modeled so that behavior of the LTI system is modeled accurately. In order to obtain physically meaningful simulations in the time domain, it is necessary that the model is passive.

Equation (1) above can be represented in a compact matrix form:

$$S(s)=D+C(sI-A)^{-1}B \qquad (2)$$

Matrix, D, is a square matrix containing the elements $d^{nm}$. The matrix, C, contains the residues $c^{nm}$, and matrix, A, is a complex or real matrix containing the poles $p^{nm}$. The matrix, B, comprises 0's and 1's, mapping the poles and residues to the correct element locations in the scattering matrix, for example as described in "Equivalent SPICE Circuit With Guaranteed Passivity From Non-Passive Models" (A. Lamecki and M. Mrozowski, IEEE Transactions on Microwave Theory and Techniques, 55:526-532, March 2007). Matrix, I, is the identity matrix of the same size as the matrix, A. It should be appreciated that the inversion of (sI–A) is trivial since matrix, A, is a diagonal matrix.

The set of matrices ABCD is referred to as a "state-space representation" of the rational function expressed in equation (1) above, and describes the broadband behavior of the LTI system in both the frequency- and the time-domain. In this respect, for simulation purposes, it is not sufficient for the model to represent the LTI system over the range of data initially obtained, and it is typically necessary to be able to model the broadband behavior of the LTI system being modeled. In order to "map" the rational function, which is a model of reduced-order, to a (non-linear) circuit simulation scenario, one has to represent the rational function (model) in the state-space form:

$$\begin{cases} \dot{x}(t) = Ax(t) + Bu(t) \\ y(t) = Cx(t) + Du(t) \end{cases} \qquad (3)$$

In equation (3), u(t) is an input signal and y(t) is an output signal, where x(t) is a so-called "internal state" of equation (3), ẋ(t) being the first derivative of x(t) with respect to time.

It is assumed that the LTI system is causal and strictly stable. Consequently, all poles, in particular all eigenvalues of the matrix, A, have negative real parts.

As mentioned above, it is necessary for the rational function described above to be passive in order to perform physically meaningful simulations in the time domain. In this respect, the model of the LTI system is passive if no energy is created within the system represented by the model. Consequently, in order to have a passive state, it is required that, in the frequency domain (i.e. $s=j\omega$), all singular values, $\sigma(j\omega)$, of the scattering matrix, $S(s=j\omega)$ are smaller than 1.0, as described in "Passivity Enforcement via Perturbation of Hamiltonian Matrices" (S. Grivet-Talocia, IEEE Transactions on Circuits and Systems, 51:1755-1769, September 2004):

$$\max_{\omega} \sigma(j\omega) \leq 1.0 \quad \forall \omega \qquad (4)$$

Clearly, due to the infinite number of frequencies, one cannot check the above criterion of inequality (4) for all possible frequencies. Consequently, a purely algebraic test is described in "Passivity Enforcement via Perturbation of Hamiltonian Matrices" (S. Grivet-Talocia, IEEE Transactions on Circuits and Systems, 51:1755-1769, September 2004) and "A bisection method for computing the $H_\infty$ norm of a transfer matrix and related problems" (V. Balakrishnan, S. Boyd and P. Kabamba, Math. Control Signals Syst., 2:207-219, 1989). Indeed, a Hamiltonian matrix can be constructed having the following form:

$$H = \begin{bmatrix} A - BR^{-1}D^T C & -BR^{-1}B^T \\ C^T Q^{-1}C & -A^T + C^T DR^{-1}B^T \end{bmatrix} \qquad (5)$$

In Hamiltonian matrix (5), $Q = D^T D - I$ and $R = DD^T - I$. Furthermore, it can be proven that the state-space model is guaranteed to be passive if the Hamiltonian matrix, H, has no purely imaginary eigenvalues:

$$\text{Re}\{\lambda_i\} \neq 0.0 \quad \forall \lambda_i \in \lambda(H) \qquad (6)$$

The condition set forth in inequality (6) is a sufficient condition, and it has also been proven that if $j\omega_0$ is an eigenvalue of the Hamiltonian matrix, H, $\omega_0$ is a so-called "crossover frequency" from a passive frequency interval to a non-passive frequency interval or vice-versa where the model lacks passivity.

If the model is not passive, the challenge is therefore to modify the state-space representation, ABCD, so that all eigenvalues of the Hamiltonian matrix, H, have a non-vanishing real part, whilst preserving the overall behavior of the model pre-modification. In this respect, a number of so-called "passivity enforcement" methods are in existence. For example, "Passivity Enforcement via Perturbation of Hamiltonian Matrices" (S. Grivet-Talocia, IEEE Transactions on Circuits and Systems, 51:1755-1769, September 2004) describes a method of directly modifying the Hamiltonian matrix, H, by evaluating a first-order approximation of perturbation of the eigenvalues by modifying the residues. However, this technique is computationally expensive, because an eigenvector determination of the Hamiltonian matrix, H, is required and the Hamiltonian matrix, H, grows in accordance with $2N_p^2 K$, $N_p$ being the number of ports of the model and K being the number of poles of the model. In "Equivalent SPICE Circuit With Guaranteed Passivity From Non-Passive Models" (A. Lamecki and M. Mrozowski, IEEE Transactions on Microwave Theory and Techniques, 55:526-532, March 2007), instead of perturbing the residues, a method is described that involves perturbation of the poles. However, this technique also requires the eigenvector calculation of the Hamiltonian matrix, H.

"Computer Code for Passivity Enforcement of Rational Macromodels by Residue Perturbation" (B. Gustavsen" IEEE Transactions on Advanced Packaging, 2:209-215, May 2007), "Fast Passivity Verification and Enforcement via Reciprocal Systems for Interconnects With Large Order Macromodels" (R. Achar, D. Saraswat and M. Nakhla, IEEE Transactions on Very Large Scale Integration (VLSI) systems, 15:48-59, January 2007), and "A Fast Algorithm and Practical Considerations for Passive Macromodeling of Measured/Simulated Data, IEEE Transactions on Advanced Packaging, 27:57-70, February 2004), describe different passivity enforcement techniques, but these techniques are also computational very expensive since a constrained optimization problem must be solved iteratively. Consequently, the high computation cost results in increased demand upon a processing resource supporting simulation software and hence, typically, reduced performance speeds. Also, a number of the passivity enforcement techniques described are not always capable of ensuring passivity without introducing an unacceptably large deviation into data generated by the revised model from the data generated by the original model.

SUMMARY

According to a first aspect of the present invention, there is provided a linear time-invariant system modeling apparatus, comprising: a processing resource arranged to receive, when in use, model data constituting to a model of a linear time-invariant system, the model data including residual value data and scattering data, wherein the processing resource is arranged to perform, when in use, a single value decomposition in respect of the scattering data, the scattering data corresponding, when expressed in matrix form, to a scattering matrix in a state-space representation of the model; and the processing resource is also arranged to use, when in use, a result of the single value decomposition in order to generate residual value modification data, and apply the residual value modification data to the residual value data, the residual value data corresponding, when expressed in the matrix form, to a residual value matrix in the state-space representation of the model.

The single value decomposition may be performed in respect of a plurality of frequencies within the predetermined frequency range. The plurality of frequencies may be substantially equally spaced.

Application of the residual value modification data by the processing resource may modify the model; the modified model may be obtained in an iteration of an iterative process.

The residual value modification value may be generated in respect of a frequency in a predetermined frequency range. The frequency range may have a lower limit of substantially 0 Hz.

The apparatus may further comprise: an initial set of frequency data; wherein the initial set of frequency data may be associated with determination of the model prior to modification.

The initial set of frequency data and corresponding value data may serve as a basis for generation of the model prior to modification.

The model may have a frequency response comprising a number of intervals that are non-passive. The processing resource may be arranged to determine a transition location between a passive interval and a non-passive interval of the number of intervals that are non-passive within a predetermined frequency range.

The processing resource may be arranged to determine the transition location by processing the model data in a manner corresponding to generation of a Hamiltonian matrix in respect of the model data, when expressed in matrix form.

A first transition location and a second transition location may reside within the predetermined frequency range; the first and second transition locations may have an interval therebetween; and the processing resource may be arranged to calculate a singular value between the first and second transition locations.

The singular values may be a maximum singular value. The singular value may be determined in respect of a frequency point substantially at a mid-point between the first and second transition locations.

The processing resource may be arranged to calculate a plurality of singular values respectively corresponding to a plurality of intervals of a frequency response of the model, and to identify a maximum frequency associated with a highest transition location in respect of the number of intervals where a transition from a non-passive interval to a passive interval exists.

The processing resource may be further arranged to select a larger frequency of: a highest frequency of the initial set of frequency data and the maximum frequency associated with the highest transition location, the larger frequency constituting a basis for calculating an upper limit of the predetermined frequency range.

A heuristically determined factor may be applied to the larger frequency in order to generate the upper limit of the predetermined frequency range. The heuristically determined factor may be greater than about 1. The heuristically determined factor may be between about 1 and about 2, for example between about 1 and about 1.5. The heuristically determined factor may be less than about 1.75. The heuristically determined factor may be between about 1 and about 1.3, for example between about 1.15 and about 1.25, such as about 1.2.

The singular value decomposition may be performed using the following relationship, when expressed in matrix form: $S=U\Sigma V^H$, where: S may correspond to a scattering matrix comprising the scattering data, U and V may be unitary matrices, and $\Sigma$ may be a positive, real-valued, diagonal matrix.

The processing resource may be arranged to generate a modified diagonal matrix based upon the positive, real-valued, diagonal matrix so that the modified diagonal matrix is free of values corresponding to non-passive intervals in the predetermined frequency range.

Generation of the modified diagonal matrix may be based upon the following relationship, when expressed in form: $\Sigma_{viol}=\Sigma\Pi-\Psi$, where $\Sigma_{viol}$ may be the modified diagonal matrix and $\Pi$ and $\Psi$ may be constraints.

The constraints may be:

$\Pi|_{ii}, \Sigma_{ii}\leq\delta=0 \; \Pi|_{ii}, \Sigma_{ii}>\delta=1$ $\Psi|_{ii}, \Sigma_{ii}\leq\delta=0 \; \Psi|_{ii}, \Sigma_{ii}>\delta=\delta$ where $\delta$ is a value less than or equal to about 1.0.

The modified diagonal matrix may be used to generate data associated with non-passive intervals based upon the following relationship, when expressed in matrix form: $S_{viol}(j\omega_{eval})=U\Sigma_{viol}V^H \; \omega_{eval}\epsilon\Omega_{eval}$, where $S_{viol}$ may be the data associated with non-passive intervals and $\omega_{eval}$ may be a frequency.

The processing resource may be arranged to use data associated with the modified diagonal matrix in order to derive data associated with non-passive intervals in the predetermined frequency range.

The processing resource may be arranged to use the data associated with the non-passive intervals in order to generate the residual value modification data.

The residual value modification data may be generated based upon the following relationship, when expressed in matrix form: $S_{viol}=C_{viol}(sI-A_0)^{-1}B_0$, where: $S_{viol}$ may correspond to data associated with non-passive intervals; $C_{viol}$ may correspond to the residual value modification data; A, may be a complex diagonal matrix comprising poles of the model; and B may be a mapping matrix.

The processing resource may be arranged to apply the residual value modification data to the residual value data by subtracting the residual value modification data from the residual value data.

The processing resource may be arranged to generate a modified state-space representation corresponding to a modification of the model using a result of the application of the residual value modification data to the residual value data.

The processing resource may be arranged to determine whether the modified model is passive.

The processing resource may be arranged to generate a Hamiltonian matrix using data corresponding to the modified state-space representation associated with the modification of the model.

The modified state-space representation which may correspond to the modification of the model may be used to form a subsequent modified state-space representation corresponding to a subsequent modification of the model so as to converge the model to a passive status.

According to a second aspect of the invention, there is provided a circuit modeling apparatus comprising the linear time-invariant system modeling apparatus as set forth above in relation to the first aspect of the invention.

According to a third aspect of the invention, there is provided a method of generating a passive model of a linear time-invariant system from a non-passive model of the linear time-invariant system, the method comprising: receiving model data constituting to a model of the linear time-invariant system, the model data including residual value data and scattering data; performing a single value decomposition in respect of the scattering data, the scattering data corresponding, when expressed in matrix form, to a scattering matrix in a state-space representation of the model; using a result of the single value decomposition in order to generate residual value modification data; applying the residual value modification data to the residual value data, the residual value data corresponding, when expressed in matrix form, to a residual value matrix in the state-space representation of the model.

According to a fourth aspect of the invention, there is provided a computer program element comprising computer program code means to make a computer execute the method as set forth above in relation to the third aspect of the invention.

The computer program element may be embodied on a computer readable medium.

It is thus possible to provide a linear time-invariant system modeling apparatus and a method of generating a passive model from a rational model that are capable of providing a passive version of a non-passive model in the time domain without employing computationally expensive optimization techniques with boundary conditions, because deviation of output data generated by the passive model from output data generated by the non-passive model is maintained to a minimum. Furthermore, calculation of eigenvalues of a Hamiltonian matrix is required only a limited number of times, for example no more than two or three times. Also, due to the small size of the scattering matrices, performance of the singular value decomposition a large number of times does not make the computational overhead significant. In the manner employed, the eigenvalues of the Hamiltonian matrix do not constitute a significant contribution to the processing overhead of when modifying the model. It is also possible to provide an apparatus and method that is very robust, due to the local suppression of occurrences of passive intervals with a predefined set of poles. The apparatus and method are also compatible with the existing Vector Fitting technique and so provide improved flexibility.

BRIEF DESCRIPTION OF THE DRAWINGS

At least one embodiment of the invention will now be described, by way of example only, with reference to the accompanying drawings, in which.

DETAILED DESCRIPTION

Throughout the following description identical reference numerals will be used to identify like parts.

Figure 1:
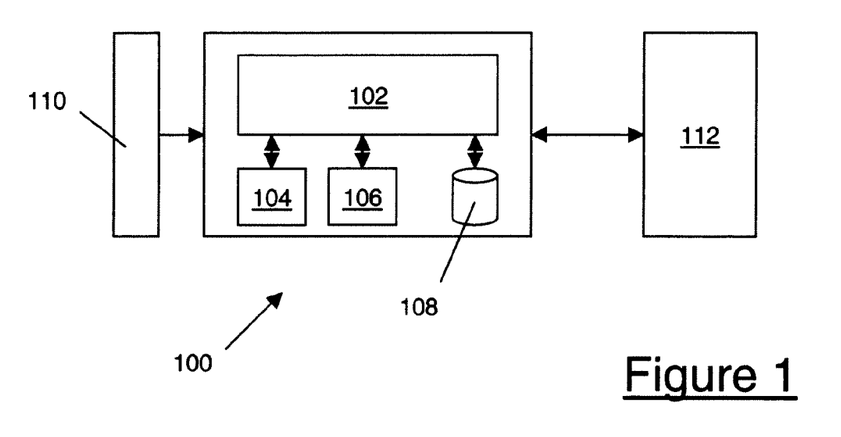
FIG. 1 is a schematic diagram of a modeling apparatus constituting an embodiment of the invention.

Referring to FIG. 1, a linear time-invariant system modeling apparatus, for example a circuit modeling apparatus, is a suitably programmed Personal Computer (PC) 100 and comprises a processing resource 100, the processing resource 102 being, in this example, a microprocessor and associated chipset (not shown) disposed on a motherboard. The processing resource 102 is coupled to a volatile memory, for example a Random Access Memory (RAM) 104, and a non-volatile memory, for example a Read Only Memory (ROM) 106. A writable storage medium, for example a hard disc drive 108 is also coupled to the processing resource 102. The processing resource 102 is also coupled to one or more input devices 110, for example a keyboard and/or a graphics tablet. An output device 112, for example a Visual Display Unit (VDU), such as a Liquid Crystal Display (LCD) monitor, is coupled to the microprocessor 102. The processing resource 100 is arranged to support an operating system, for example Windows™ available from Microsoft Corporation or a distribution of the Linux operating system available from sources such as Ubuntu™ and Red Hat™. In this example, the operating system supports an Advanced Design System available from Agilent Technologies, Inc, but adapted to operate in the manner described later herein. In this respect, processing steps taken will be described in terms of matrices and matrix operations. However, the skilled person should appreciate that the processing steps and operations can be performed in relation to data irrespective of format.

Figure 2:
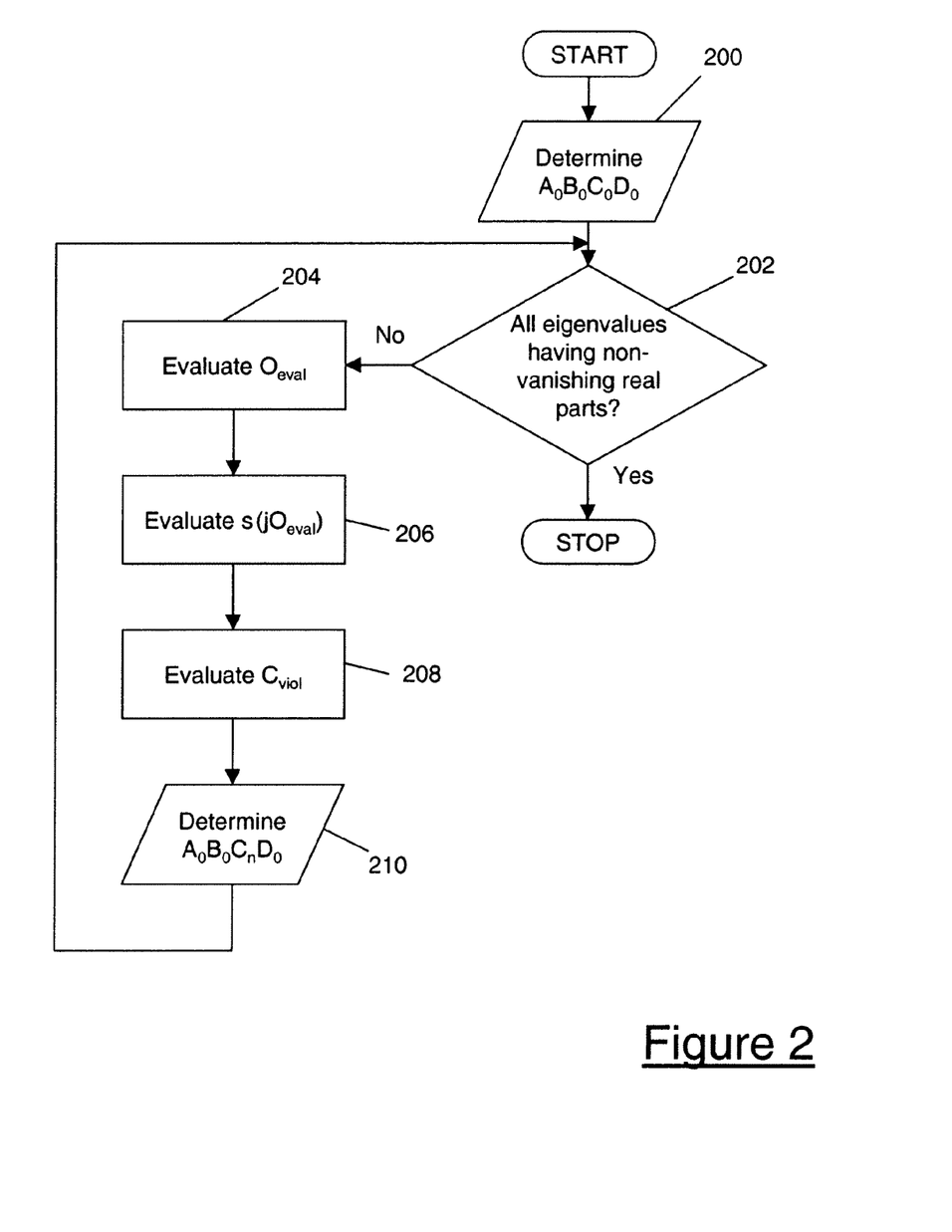
FIG. 2 is a flow diagram of a method of passivity enforcement constituting another embodiment of the invention.

Turning to FIG. 2, an initial LTI system is selected as representative of a technical application. As the skilled person will appreciate, this is simply a matter of choice and so not directly relevant to the examples described herein. Consequently, for the sake of simplicity and conciseness of description, it will be assumed that the initial LTI system has been pre-determined. An initial set of matrices, $A_0B_0C_0D_0$, constituting an initial stable state-space representation of the LTI system is then generated (Step 200) using, for example, a Vector Fitting technique of the type, such as described by Gustavsen and Semlyen already described above. The initial stable state-space representation of the LTI system constitutes a model of the LTI. The determination of the initial set of matrices, $A_0B_0C_0D_0$, does not take into account the fact that the model is possibly not passive but instead constitutes a state-space representation of the LTI system that generates output data that is as close as possible, in a least-square sense, to original output data provided as representing the behavior of the LTI system.

Next, a so-called passivity enforcement algorithm is executed by the processing resource 102. The passivity enforcement algorithm verifies whether the initial state-space representation, $A_0B_0C_0D_0$, is passive. Verification of passivity (Step 202) is achieved by firstly generating a Hamiltonian matrix, H, of the form represented by definition (5) described above. The passivity enforcement algorithm then calculates eigenvalues, $\lambda(H)$, of the Hamiltonian matrix, H, and determines whether the eigenvalues calculated comprise any purely imaginary eigenvalues, $\lambda(H)$, as set forth in condition (6), i.e. whether any of the eigenvalues have vanishing real parts.

Figure 3:
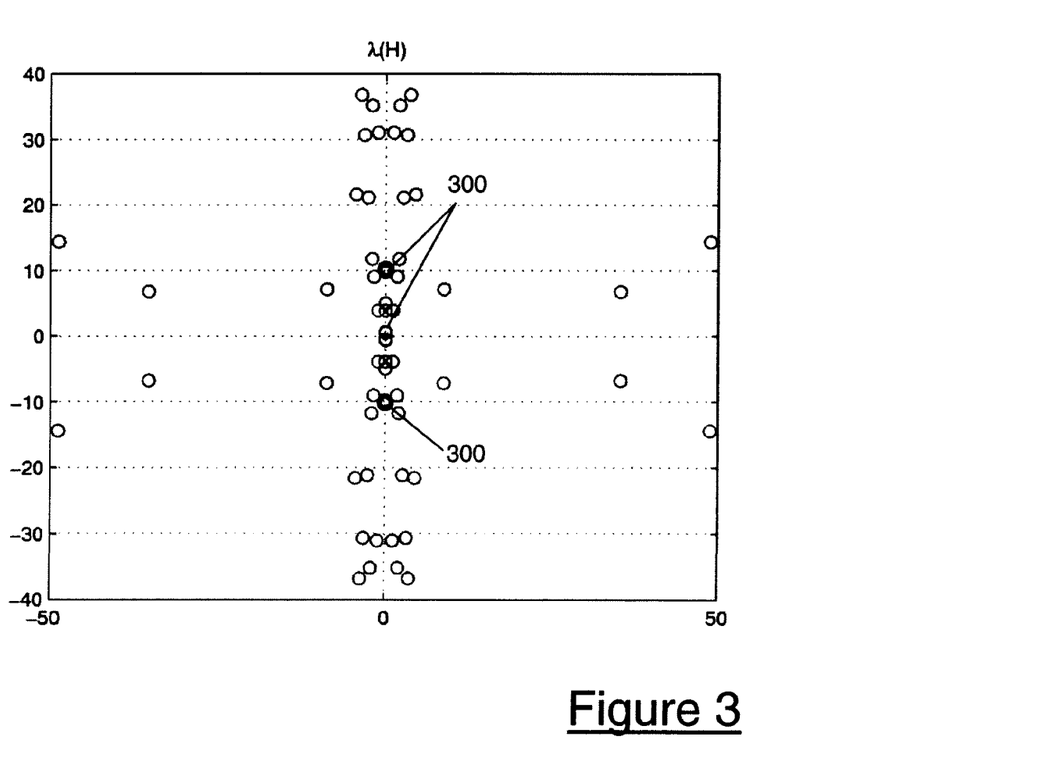
FIG. 3 is a plot of eigenvalues of a Hamiltonian matrix relating to a state-space representation of a model to be made passive using the apparatus of FIG. 1.

If the Hamiltonian matrix, H, associated with the state-space representation, at this stage in this example, has no purely imaginary eigenvalues, the initial state-space representation, $A_0B_0C_0D_0$, is passive, and the passivity enforcement algorithm stops as the objective of generating a model of the LTI system that is passive has been achieved. Often, however, the initial state-space representation comprises one or more purely imaginary eigenvalues 300 (FIG. 3) and so further steps of the passivity enforcement algorithm need to be executed.

Figure 4:
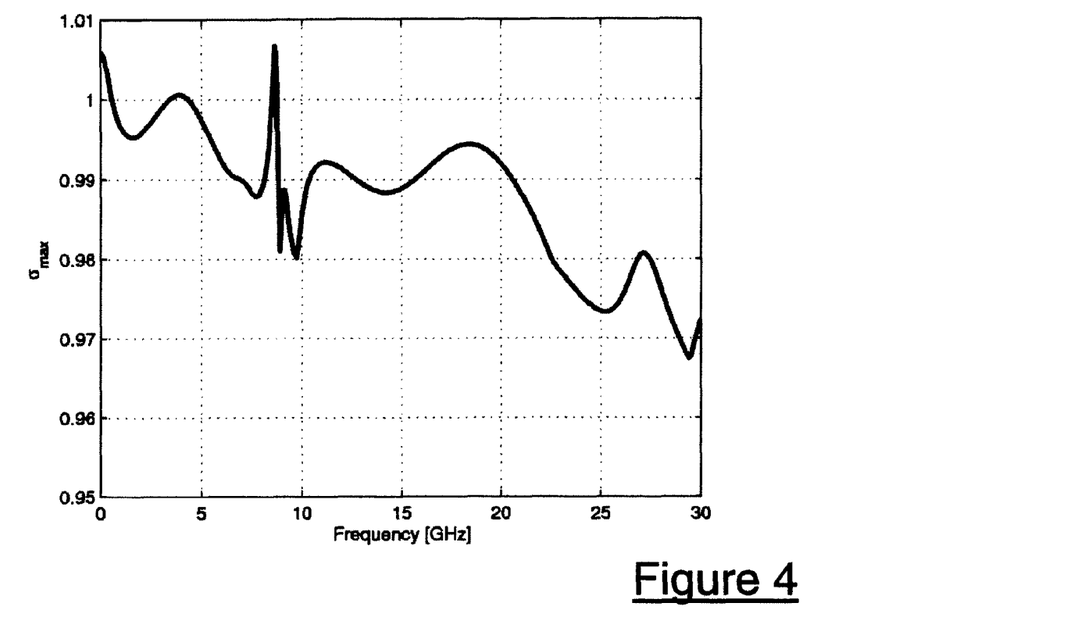
FIG. 4 is a plot of singular values generated by the apparatus of FIG. 1.

Since condition (6) above has already been checked, the eigenvalues that are purely imaginary identify crossing points in the frequency domain from a passive interval to a non-passive interval or vice-versa. In order to determine whether an interval is passive or not, the maximum singular value, for example at the middle of each frequency interval, is calculated. When the maximum singular value calculated is greater than 1.0 (FIG. 4), the interval is non-passive, otherwise the interval is passive.

As a result of calculating the maximum singular values for the middle of each frequency interval identified, knowledge is obtained as to the identity or identities of the frequency domain intervals where the maximum singular value of the model exceeds 1.0 and this information is used to generate (Step 204) a frequency sweep range, $\Omega_{eval}$. The frequency sweep range, $\Omega_{eval}$, is a set of discrete evaluation frequency points. The frequency sweep range, $\Omega_{eval}$, is generated by firstly distributing a large number of frequency points, for example 500 frequency points, equidistantly over a range of frequencies starting at 0 Hz (DC) to a maximum frequency that is above, for example by 20%, a selected frequency, the selected frequency being determined by a choice of the largest of: a maximum frequency of the initial set of input frequency data described above and used when generating the initial stable state-space matrices, $A_0 B_0 C_0 D_0$, and a highest frequency of the crossing points from a non-passive interval to a passive interval as determined through use of the maximum singular values exceeding 1.0 calculated above. Additionally, the frequency sweep range, $\Omega_{eval}$, is supplemented by providing a relatively small number, for example 10, of equidistant additional frequency points for each of the non-passive intervals identified. The factor of 20% described above is exemplary only and the factor employed is, in this example, heuristically determined. Consequently, the skilled person should appreciate that other values can be selected. The heuristically determined factor can be between about 0% and about 100%, for example between about 0% and about 50% above the selected frequency. The heuristically determined factor can be an increase of less than about 75%. The heuristically determined factor can be between about 0% and about 30%, for example between about 15% and about 25%, such as about the 20% described above.

Once the frequency sweep range, $\Omega_{eval}$, has been determined, for each of the frequency points, $\omega_{eval}$, in the determined frequency sweep, $\omega_{eval}$, a singular value decomposition is performed (Step 206) in respect of the scattering matrix, S, as defined by the matrices of the initial state-space representation.

$$S(j\omega_{eval})=D_0+C_0(j\omega_{eval}I-A_0)^{-1}B_0=U\Sigma V^H \omega_{eval}\epsilon\Omega_{eval} \quad (7)$$

In equation (7), $\Sigma$ is a positive, real-valued, diagonal matrix, the diagonal of the matrix, $\Sigma$, having singular values. U and V are unitary transformation matrices. Furthermore, it should be noted that, in respect of the frequency points, $\omega_{eval}$, of the frequency sweep range, $\Omega_{eval}$, where the model is non-passive, the respective values contained in the matrix, $\Sigma$, exceed 1.0. The amount by which the respective values exceed 1.0 constituting an indication of degree of lack of passivity.

After performance of the singular value decomposition (Step 206), the processing resource 102 generates a set of "violation parameters", $S_{viol}$, using the following definition, which is a variant of equation (7).

$$S_{viol}(j\omega_{eval})=U\Sigma_{viol}V^H \omega_{eval}\epsilon\Omega_{eval} \quad (8)$$

$\Sigma_{viol}$ is a truncated version of the matrix, $\Sigma$. In equation (8), $\Sigma_{viol}$ is defined as:

$$\Sigma_{viol}=\Sigma\Pi-\Psi \quad (9)$$

In equation (9), $\Pi$ and $\Psi$ are square diagonal matrices, defined as follows:

$$\Pi|_{ii}, \Sigma_{ii}\leq\delta=0 \; \Pi|_{ii}, \Sigma_{ii}>\delta=1$$

$$\Psi|_{ii}, \Sigma_{ii}\leq\delta=0 \; \Psi|_{ii}, \Sigma_{ii}>\delta=\delta \quad (10)$$

The value of $\delta$ is selected so as to be slightly less than 1.0, for example between about 0.85 to 1.0, such as 0.999, in order to promote convergence of the algorithm. To illustrate this step, a worked numerical example is set out below. In this respect, at a given frequency, $\omega_{eval}$, that is a member of the frequency sweep range, $\Omega_{eval}$, and is located within a non-passive interval in the frequency sweep range, $\Omega_{eval}$, the following scattering matrix, S, is the result of the evaluation of equation (2) at a given frequency $\omega_{eval}$:

$$S(j\omega_{eval}) = \begin{bmatrix} -0.1509 + 0.0435i & 0.6444 - 0.7277i \\ 0.6444 - 0.7277i & 0.0017 - 0.1818i \end{bmatrix} \quad (11)$$

The single value decomposition is then performed (Step 206), as explained above, to yield:

$$S(j\omega_{eval}) = U \begin{bmatrix} 1.0042 & 0 \\ 0 & 0.9690 \end{bmatrix} V^H \quad (12)$$

In equation (12), U and V have the following values:

$$U = \begin{bmatrix} -0.5009 - 0.4343i & 0.6677 + 0.3386i \\ 0.5600 + 0.4969i & -0.3744 + 0.5471i \end{bmatrix} \quad (13)$$

$$V = \begin{bmatrix} -0.6630 & -0.7486 \\ -0.0976 & 0.0865 + 0.6573i \end{bmatrix} \quad (14)$$

The violation parameters, $S_{viol}(j\omega)$, are then obtained by applying equations (8) and (9) above for each frequency point, $\omega_{eval}$, using a value for $\delta$ of 0.999:

$$S_{viol}(j\omega_{eval}) = U \sum_{viol} V^H \quad (15)$$

$$= \begin{bmatrix} 0.0017 + 0.0015i & 0.0019 - 0.0017i \\ 0.0019 - 0.0017i & -0.0016 - 0.0024i \end{bmatrix}$$

In equation (15), $\Sigma_{viol}$ respects the constraints (10) set out above and so all values that are less than $\delta$ have been set to zero, i.e. the values associated with non-passive intervals have been isolated:

$$\sum_{viol} = \begin{bmatrix} 0.0052 & 0 \\ 0 & 0 \end{bmatrix} \quad (16)$$

The above procedure is repeated for all frequency points, $\omega_{eval}$, in the frequency sweep range, $\Omega_{eval}$, so that a set of the violation parameters, $S_{viol}$, is obtained.

The set of violation parameters, $S_{viol}$, is then used in order to modify the initial state-space model in order to try to make the initial state-space model passive, or at the very least cause the model to converge upon a passive status. In this example, the residues matrix, C, in particular (at this iteration in the process of obtaining a passive model) the initial set of residues arranged as the initial residue matrix, $C_0$, is modified in respect of the frequency sweep range, $\Omega_{eval}$. Hence, the poles of the initial state-space representation, $A_0$, are used and not relocated.

By solving a matrix equation in the manner set out in "Rational Approximation of Frequency Domain Responses by Vector Fitting" (B. Gustavsen and A. Semlyen, IEEE Transactions on Power Delivery, 14:1052-1061, July 1999) mentioned above, an expression to determine a "residue modification", $C_{viol}$, for the residue matrix, C, in particular the initial residue matrix, $C_0$, at this stage in the process, has been devised for converging the model to a passive state.

$$S_{viol} = C_{viol}(sI - A_0)^{-1} B_0 \quad (17)$$

The residue modification, $C_{viol}$, is then evaluated (Step 208) using equation (17). $C_{viol}$, represents a set of expansion coefficients for the areas that are not passive within a set of basis functions as defined by the poles of the model. As no pole relocation procedure is required, the processing overhead for determining the residue modification, $C_{viol}$, is very small.

Once the residue modification, $C_{viol}$, has been evaluated (Step 208), the residue modification, $C_{viol}$, is subtracted from the initial residue matrix, $C_0$, in order to obtain an updated state-space model (Step 210) having the updated state-space representation set of matrices.

$$C_1 = C_0 - C_{viol} \quad (18)$$

The updated state-space representation of the model after a first iteration of the above steps is $A_0 B_0 C_1 D_0$. After n iterations, the updated state-space representation is $A_0 B_0 C_n D_0$. The residue modification, $C_{viol}$, is employed to suppress components of the residue matrix, C, the components being responsible for non-passive intervals in the model.

Figure 6:
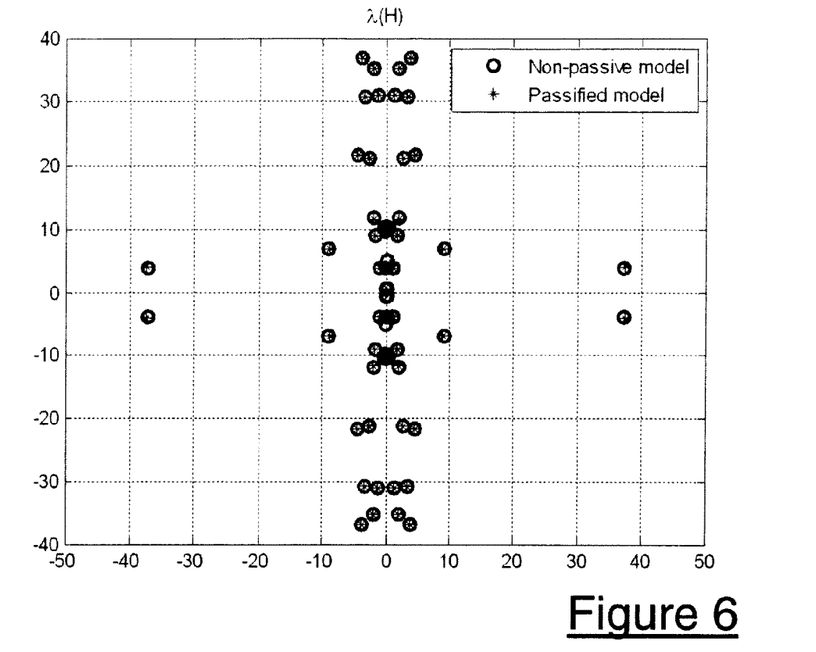
FIG. 6 is a comparative plot of eigenvalues of the Hamiltonian matrix relating to the state-space representation of the model to be made passive before modification and eigenvalues of a Hamiltonian matrix relating to a modified state-space representation of a modified model.
Figure 7:
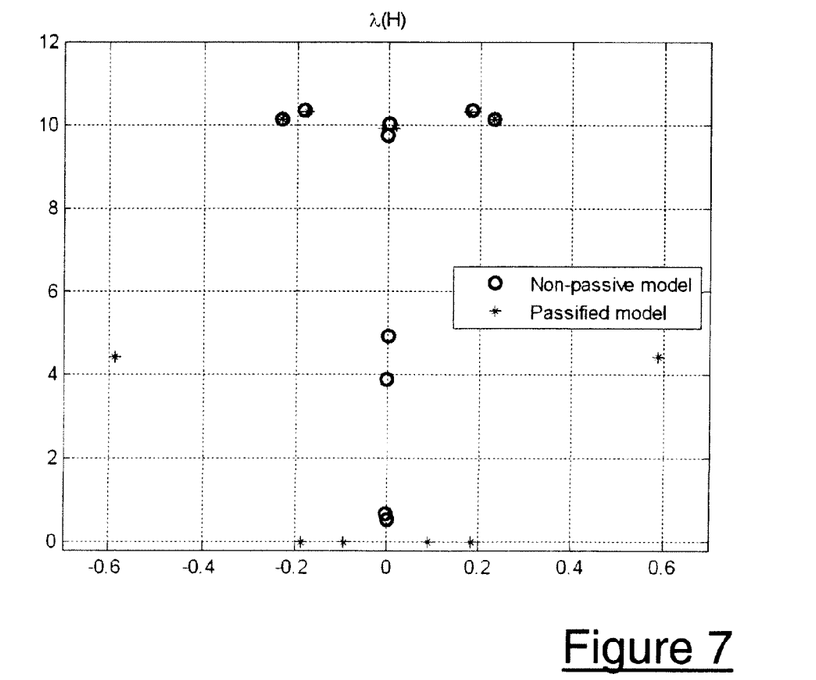
FIG. 7 is a more detailed plot of part of the plot of FIG. 6.

After each iteration, once the updated model has been generated, the processing resource 102 checks that the updated state-space representation, $A_0 B_0 C_n D_0$, of the updated model is passive by re-checking the eigenvalues (Step 202) of the Hamiltonian matrix for the updated state-space representation, $A_0 B_0 C_n D_0$, in the manner described above. If all the eigenvalues of the updated state-space representation, $A_0 B_0 C_n D_0$, of the updated model have a non-vanishing real part, the updated model is passive and the above process stops. Indeed, referring to FIGS. 6 and 7, whilst purely imaginary eigenvalues appear to exist, closer inspection of FIG. 7 clearly shows that the eigenvalues of the updated model generated as a result of application of the above technique are not purely imaginary and so the updated model is passive.

However, if the eigenvalues do not have a non-vanishing real part, the updated model is not yet passive and the above steps are repeated in order to determine a new frequency sweep range in order to arrive at a new residue modification, $C_{viol}$, and hence a new updated state-space representation of a new updated model.

Figure 5:
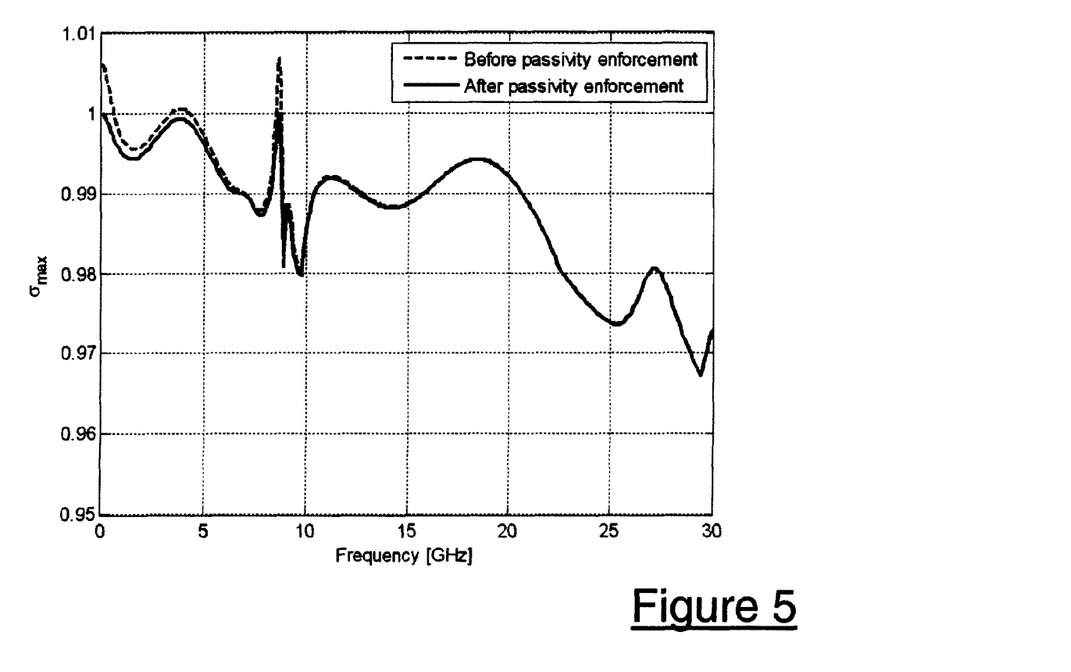
FIG. 5 is a comparative plot of singular values generated by the apparatus of FIG. 1.
Figure 8:
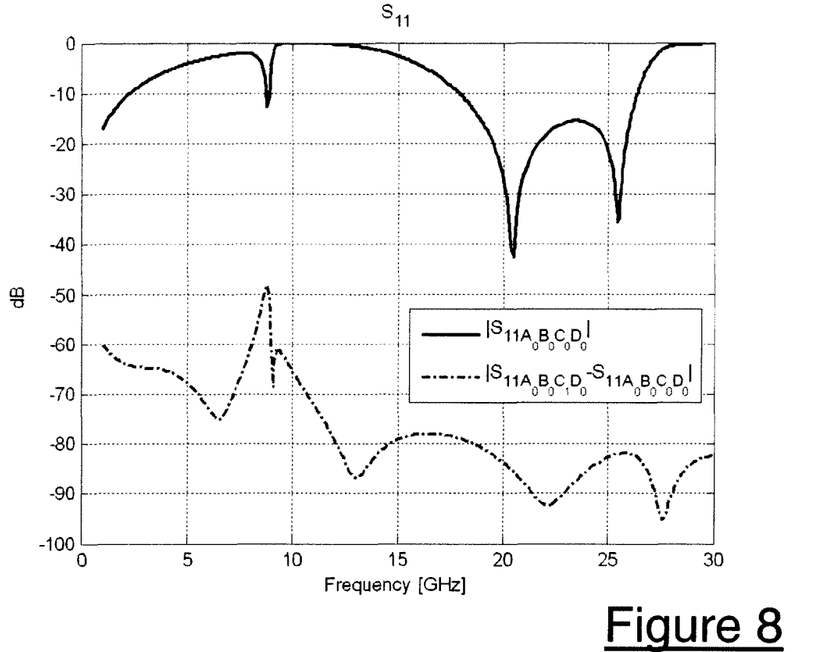
FIG. 8 is a comparative plot of an element of the scattering matrix and deviation from the element of the scattering matrix after processing by the apparatus of FIG. 1.
Figure 9:
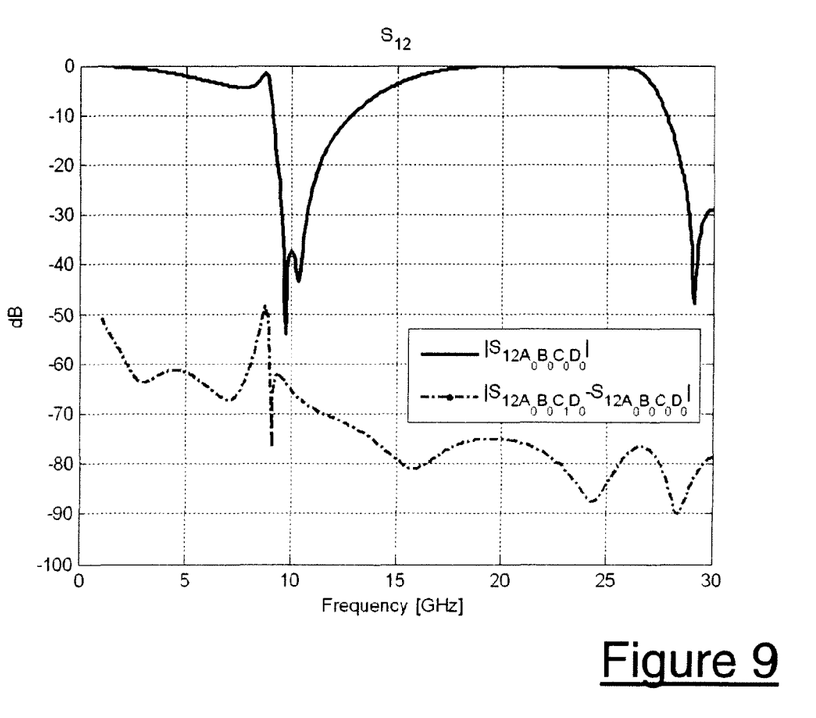
FIG. 9 is another comparative plot of another element of the scattering matrix and deviation from the another element of the scattering matrix after processing by the apparatus of FIG. 1.

As a result of the manner in which the updated state-space representation of the model is "built" using equation (18), occurrences of passive intervals are suppressed (FIG. 5). In contrast, over intervals in the frequency sweep, $\Omega_{eval}$, that are passive prior to modification of the model, virtually no deviation from the passive status of these intervals is introduced (FIGS. 8 and 9), since the respective violation parameters, $S_{viol}$, in respect of the passive intervals are zero. Hence, modifications made are substantially localized.

Whilst, in the above examples, reference has been made to selection of a particular number of discrete evaluation frequency points in the frequency sweep range, $\Omega_{eval}$, the skilled person should appreciate that a greater or smaller number of discrete evaluation frequency points within the frequency sweep range, $\Omega_{eval}$, can be employed. However, where fewer frequency points are employed, computational overhead is reduced due to the reduced number of singular value decompositions that need to be executed, but at the expense of an increased risk of creation of passive intervals in the frequency sub-ranges between the evaluation frequency points selected, because calculation of the residue modification does not take into account the frequency sub-ranges.

Alternative embodiments of the invention can be implemented as a computer program product for use with a computer system, the computer program product being, for example, a series of computer instructions stored on a tangible data recording medium, such as a diskette, CD-ROM, ROM, or fixed disk, or embodied in a computer data signal, the signal being transmitted over a tangible medium or a wireless medium, for example, microwave or infrared. The series of computer instructions can constitute all or part of the functionality described above, and can also be stored in any memory device, volatile or non-volatile, such as semiconductor, magnetic, optical or other memory device.

What is claimed is:

1. A linear time-invariant system modeling apparatus, comprising:
   a processing resource arranged to receive, when in use, model data constituting to a model of a linear time-invariant system, the model data including residual value data and scattering data, wherein
   the processing resource is arranged to perform, when in use, a singular value decomposition in respect of the scattering data, the scattering data corresponding, when expressed in matrix form, to a scattering matrix in a state-space representation of the model; and
   the processing resource is also arranged to use, when in use, a result of the singular value decomposition in order to generate residual value modification data for a non-passive interval of a predetermined frequency range of a linear time-invariant system, and apply the residual value modification data to the residual value data, the residual value data corresponding, when expressed in the matrix form, to a residual value matrix in the state-space representation of the model.

2. The apparatus according to claim 1, wherein application of the residual value modification data by the processing resource modifies the model, the modified model being obtained in an iteration of an iterative process.

3. The apparatus according to claim 1, wherein the residual value modification value is generated in respect of a frequency in a predetermined frequency range.

4. The apparatus according to claim 3, further comprising:
   an initial set of frequency data; wherein
   the initial set of frequency data is associated with determination of the model prior to modification.

5. The apparatus according to claim 4, wherein the processing resource is arranged to calculate a plurality of singular values respectively corresponding to a plurality of intervals of a frequency response of the model, and to identify a maximum frequency associated with a highest transition location in respect of the number of intervals where a transition from a non-passive interval to a passive interval exists.

6. The apparatus according to claim 5, wherein the processing resource is further arranged to select a larger frequency of: a highest frequency of the initial set of frequency data and the maximum frequency associated with the highest transition location, the larger frequency constituting a basis for calculating an upper limit of the predetermined frequency range.

7. The apparatus according to claim 6, wherein a heuristically determined factor is applied to the larger frequency in order to generate the upper limit of the predetermined frequency range.

8. The apparatus according to claim 1, wherein the model has a frequency response comprising a number of intervals that are non-passive.

9. The apparatus according to claim 8, wherein the processing resource is arranged to determine a transition location between a passive interval and a non-passive interval of the number of intervals that are non-passive within a predetermined frequency range.

10. The apparatus according to claim 9, wherein the processing resource is arranged to determine the transition location by processing the model data in a manner corresponding to generation of a Hamiltonian matrix in respect of the model data, when expressed in matrix form.

11. The apparatus according to claim 10, wherein
a first transition location and a second transition location reside within the predetermined frequency range, the first and second transition locations having an interval therebetween; and
the processing resource is arranged to calculate a singular value between the first and second transition locations.

12. A circuit modeling apparatus comprising the linear time-invariant system modeling apparatus as claimed in claim 1.

13. A linear time-invariant system modeling apparatus, comprising:
a processing resource arranged to receive, when in use, model data constituting to a model of a linear time-invariant system, the model data including residual value data and scattering data, wherein
the processing resource is arranged to perform, when in use, a singular value decomposition in respect of the scattering data, the scattering data corresponding, when expressed in matrix form, to a scattering matrix in a state-space representation of the model; and
the processing resource is also arranged to use, when in use, a result of the singular value decomposition in order to generate residual value modification data for a non-passive interval of a predetermined frequency range of a linear time-invariant system, and apply the residual value modification data to the residual value data, the residual value data corresponding, when expressed in the matrix form, to a residual value matrix in the state-space representation of the model,
wherein the singular value decomposition is performed using the following relationship, when expressed in matrix form:

$$S = U\Sigma V^H$$

where:
S corresponds to a scattering matrix comprising the scattering data,
U is a unitary matrix,
$\Sigma$ is a positive, real-valued, diagonal matrix, and
$V^H$ is a unitary transformation matrix.

14. The apparatus according to claim 13, wherein the processing resource is arranged to generate a modified diagonal matrix based upon the positive, real-valued, diagonal matrix so that the modified diagonal matrix is free of values corresponding to non-passive intervals in the predetermined frequency range.

15. The apparatus according to claim 14, wherein generation of the modified diagonal matrix is based upon the following relationship, when expressed in form:

$$\Sigma_{viol} = \Sigma \Pi - \Psi$$

where $\Sigma_{viol}$ is the modified diagonal matrix and $\Pi$ and $\Psi$ are constraints in the form of square diagonal matrices.

16. The apparatus according to claim 14, wherein the modified diagonal matrix is used to generate data associated with non-passive intervals based upon the following relationship, when expressed in matrix form:

$$S_{viol}(j\omega_{eval}) = U\Sigma_{viol}V^H \quad \omega_{eval} \in \Omega_{eval}$$

where $S_{viol}$ is the scattering data associated with non-passive intervals, $\omega_{eval}$ is a frequency, $V^H$ is a unitary transformation matrix, and $\Omega_{eval}$ is a frequency sweep range.

17. The apparatus according to claim 14, wherein the processing resource is arranged to use data associated with the modified diagonal matrix in order to derive data associated with non-passive intervals in the predetermined frequency range.

18. The apparatus according to claim 17, wherein the processing resource is arranged to use the data associated with the non-passive intervals in order to generate the residual value modification data.

19. The apparatus according to claim 14, wherein the residual value modification data is generated based upon the following relationship, when expressed in matrix form:

$$S_{viol} = C_{viol}(sI - A_0)^{-1} B_0$$

where:
$S_{viol}$ corresponds to scattering data associated with non-passive intervals;
$C_{viol}$ corresponds to the residual value modification data;
$A_0$ is a complex diagonal matrix comprising poles of the model; and
$B_0$ is a mapping matrix.

20. A computer implemented method of generating a passive model of a linear time-invariant system from a non-passive model of the linear time-invariant system, the method comprising:
receiving, using a processing resource, model data constituting to a model of the linear time-invariant system, the model data including residual value data and scattering data;
performing, using the processing resource, a singular value decomposition in respect of the scattering data, the scattering data corresponding, when expressed in matrix form, to a scattering matrix in a state-space representation of the model;
using a result of the singular value decomposition in order to generate, using the processing resource, residual value modification data for a non-passive interval of a predetermined frequency range of a linear time-invariant system;
applying, using the processing resource, the residual value modification data to the residual value data, the residual value data corresponding, when expressed in matrix form, to a residual value matrix in the state-space representation of the model.

* * * * *